(12) United States Patent
Chen et al.

(10) Patent No.: US 6,267,820 B1
(45) Date of Patent: Jul. 31, 2001

(54) CLOG RESISTANT INJECTION VALVE

(75) Inventors: Chen-An Chen, Sunnyvale; Won Bang, Santa Clara, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/248,789

(22) Filed: Feb. 12, 1999

(51) Int. Cl.⁷ .................................................. C23C 16/00
(52) U.S. Cl. ...................... 118/726; 137/605; 251/129.06; 239/398; 239/419; 239/426; 239/433; 239/102.1; 118/719; 118/715
(58) Field of Search ..................................... 137/828, 334, 137/605; 251/129.06; 239/102.1, 102.2, 584, 398, 419, 426, 433, 434; 118/719, 715, 726

(56) References Cited

U.S. PATENT DOCUMENTS

| | | |
|---|---|---|
| 3,175,567 | 3/1965 | Crawford . |
| 3,409,031 | 11/1968 | Benbow et al. . |
| 4,103,827 * | 8/1978 | Kumazawa ................. 239/8 |
| 4,566,416 * | 1/1986 | Berchtold ............... 123/458 |
| 4,684,104 * | 8/1987 | Micard ............... 251/129.05 |
| 4,762,668 | 8/1988 | Loose et al. . |
| 4,893,361 | 1/1990 | Burns . |
| 5,085,244 | 2/1992 | Funk . |
| 5,123,433 | 6/1992 | Fridsma et al. . |
| 5,383,970 * | 1/1995 | Asaba et al. ................. 118/726 |
| 5,395,592 | 3/1995 | Bolleman et al. . |
| 5,749,389 | 5/1998 | Ritrosi et al. . |
| 5,925,189 * | 7/1999 | Nguyen et al. ............ 118/726 |
| 5,962,085 * | 10/1999 | Hayashi et al. ............ 118/715 |
| 5,968,588 * | 10/1999 | Sivaramakrishnan et al. ....... 427/8 |
| 6,036,783 * | 3/2000 | Fukunaga et al. ........... 118/724 |
| 6,079,354 * | 6/2000 | Guo et al. ................. 118/719 |
| 6,176,930 * | 1/2001 | Koai et al. ................ 118/715 |

FOREIGN PATENT DOCUMENTS

| | | |
|---|---|---|
| 37 14578 A1 | 11/1987 | (DE) . |
| 2 330 284 | 7/1977 | (FR) . |

* cited by examiner

Primary Examiner—Jeffrie R. Lund
Assistant Examiner—Sylvia R. MacArthur
(74) Attorney, Agent, or Firm—Dugan & Dugan

(57) ABSTRACT

An injection valve is provided with vibration to dislodge residue therefrom and to thus avoid injection valve clogging. A wave generator which preferably generates an ultrasonic sine wave, is operatively coupled to the vaporization region of the injection valve (i.e., via the injection block, via a piezoelectric valve controller, etc.). The wave may be applied to the injection valve whenever vaporization takes place, in which case a removable trap is coupled between the injection valve and the processing chamber. Alternatively, the sonic wave may be applied to the injection valve only in conjunction with a chamber cleaning process.

20 Claims, 4 Drawing Sheets

CLOG RESISTANT INJECTION VALVE

FIELD OF THE INVENTION

The present invention relates to a clog resistant injection valve, and specifically to a clog resistant injection valve for vaporizing liquid precursors; such as triethylphosphate (TEPO) and tetraethyl orthosilicate (TEOS), and for delivering the vaporized liquids to a chemical vapor deposition (CVD) chamber.

BACKGROUND OF THE INVENTION

CVD processing requires a number of vaporized processing liquids. These vaporized liquids are generated and supplied to a CVD chamber via a system of pipes (or "lines") and vaporizing mechanisms known as a gas delivery system. Typically a separate vaporizing mechanism is provided for vaporizing each processing liquid, and is coupled to a source of processing liquid and a source of carrier gas. Each vaporizing mechanism and processing liquid source combination within a gas delivery system is referred to as a vaporization stage. Although a number of vaporizing mechanisms exist (e.g., bubblers, injection valves, etc.), most conventional gas delivery systems employ a plurality of injection valves for vaporizing processing liquids to be delivered to a CVD chamber.

A typical injection valve comprises a vaporization region which is coupled to a processing liquid inlet for receiving a pressurized processing liquid, to a carrier gas inlet for receiving a pressurized inert carrier gas, and to an outlet for delivering a vaporized processing liquid/carrier gas mixture. The processing liquid inlet, by necessity, is small in size so as to maintain a low partial vapor pressure of the processing liquid in the carrier gas. The injection valve is heated such that when the processing liquid is injected into the carrier gas, the heat and the low partial vapor pressure of the processing liquid in the carrier gas causes the processing liquid to vaporize.

The processing liquid inlet's small size renders the processing liquid inlet susceptible to clogs which result from residue produced when processing liquid reacts with moisture or other contaminants in the gas delivery system. Thus, maintenance of conventional gas delivery systems is expensive due to injection valve clogging. A clogged injection valve can cause downtime not only of the chamber to which the clogged injection valve is coupled, but also of upstream and/or downstream chambers. In addition to costly chamber downtime, injection valves themselves are expensive, typically costing more than two thousand dollars to replace, exclusive of labor costs. Considerable effort has been devoted to developing clog resistant gas delivery systems, and numerous advances have been achieved.

A particularly worthy advance is the recognition by Applied Materials, Inc., that alloys containing nickel react with the CVD processing liquid TEPO, causing residue formation and clogging, and the recognition that chromium can repress the nickel/TEPO reaction. Thus, gas delivery components made with less than 1% nickel and with 16–27% chromium significantly reduce clogging as described in commonly assigned U.S. Pat. No. 5,925,189 (application Ser. No. 08/568,193, filed Dec. 6, 1995, AMAT No. 888/PDD/KPU8/MBE). Despite such advances, injection valve clogging remains a problem, particularly when a gas delivery system must be configured with existing nickel-containing components.

Accordingly, a need exists for a clog resistant injection valve and for a gas delivery system that can be easily and inexpensively cleaned of residue, and that resists clogging regardless of component composition.

SUMMARY OF THE INVENTION

The present invention reduces or eliminates the clogging experienced by conventional injection valves by vibrating the injection valve's vaporization region at a frequency sufficient to dislodge particles therefrom, preferably at an ultrasonic or megasonic frequency. Thus, as used herein, vibration refers to vibration sufficient to dislodge particles from an injection valve's vaporization region. A wave generator, preferably an ultrasonic sine wave generator, is coupled to the injection valve so as to vibrate the vaporization region. For example, the wave generator may be coupled to the injection valve's injection block, or may be coupled to the injection valve's piezoelectric actuator so as to vibrate the vaporization region. Vibration of the vaporization region dislodges residue from the vaporization region, the carrier gas inlet, the processing liquid inlet and the outlet, and/or prevents residue from lodging therein.

Vibration may be applied to the vaporization region whenever the processing liquid inlet is open and vaporization is in progress, in which case a removable trap is preferably coupled between the outlet and the processing chamber to which the vaporized processing liquid is supplied. Alternatively, vibration may be applied periodically for example, prior to a weekly chamber cleaning process.

A conventional injection valve may be easily and inexpensively provided with a source of vibration, thereby reducing or eliminating clogging and significantly reducing injection valve replacement costs and the downtime costs associated therewith.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
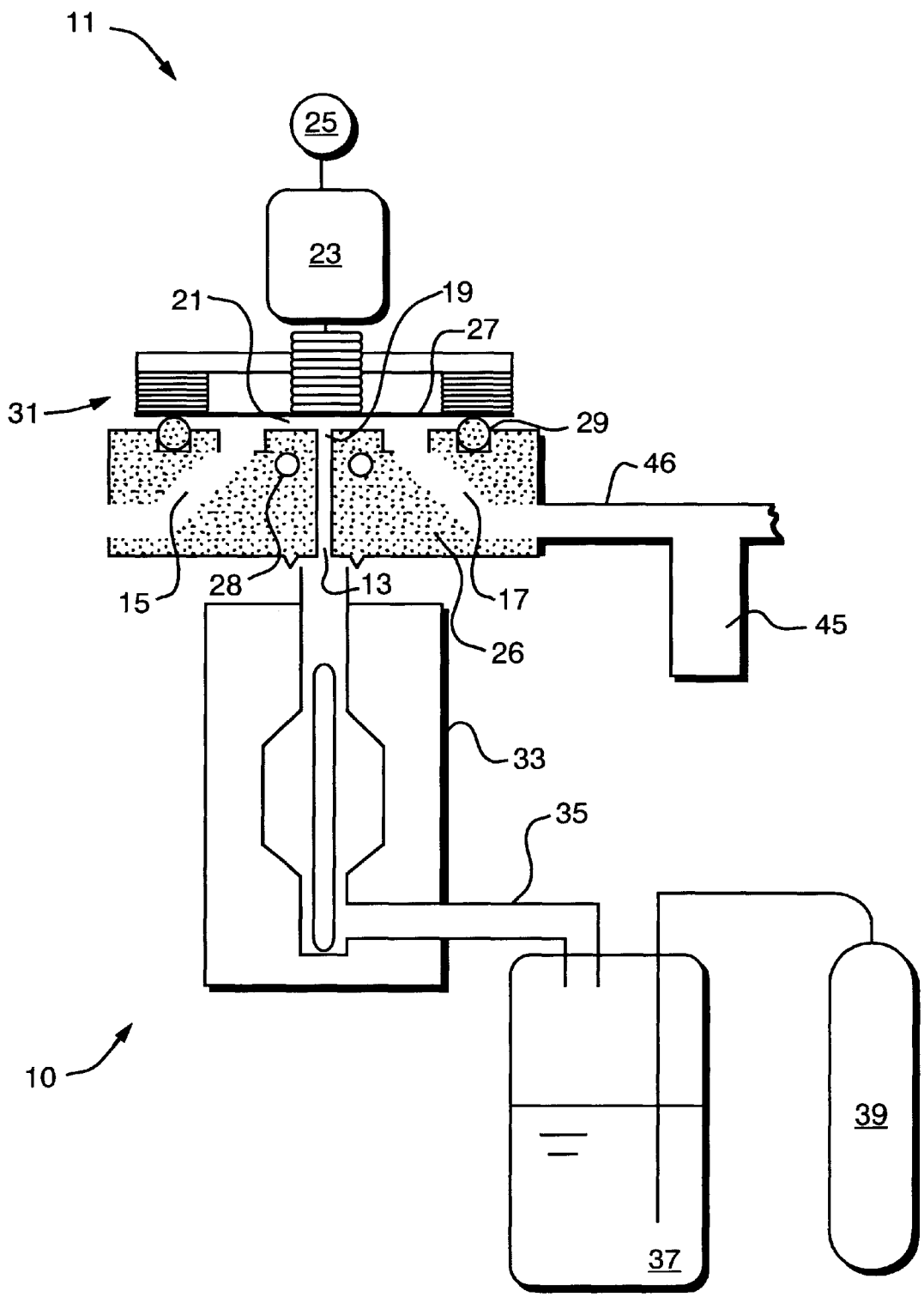
FIG. 1 is a diagrammatic side elevational view of a vaporization stage comprising a conventional injection valve and an inventive trap.

FIG. 1 is a diagrammatic side elevational view of a vaporization stage 10 comprising a conventional injection valve 11 and an inventive trap 45 (described with reference to FIGS. 2A and 2B). In pertinent part, the conventional injection valve 11 comprises a processing liquid inlet 13 for inputting a processing liquid, a carrier gas inlet 15 for inputting an inert carrier gas, and an outlet 17 for outputting a vaporized processing liquid/carrier gas mixture. Within the conventional injection valve 11, the processing liquid inlet 13 terminates at an orifice 19 leading to a central vaporization region 21 where the processing liquid inlet 13, the carrier gas inlet 15, and the outlet 17 meet. Although the configuration of the vaporization region 21 may vary from one injection valve to the next, most are configured so that the processing liquid inlet 13 may be selectively opened and closed via an increase and a decrease, respectively, in a voltage applied to a piezoelectric actuator 23 via a DC voltage generator 25.

In the exemplary injection valve 11 of FIG. 1, the vaporization region 21 is defined by an injection block 26 in which the carrier gas inlet 15, the processing liquid inlet 13 and the outlet 17 are machined, and by a flexible plate 27 (e.g., a Teflon plate) which extends above the carrier gas inlet 15, the processing liquid inlet 13, and the outlet 17. An o-ring 29 seals the flexible plate 27 to the injection block 26 beyond the carrier gas inlet 15 and the outlet 17, forming the vaporization region 21. The flexible plate 27 is held firmly against the o-ring 29 via a pressure application means 31 (such as a control valve diaphragm). The piezoelectric actuator 23 is operatively coupled to the flexible plate 27 at a location above the processing gas inlet 13, so that when the DC voltage generator 25 outputs a high voltage, expansion of the piezoelectric actuator 23 seals the flexible plate 27 against the processing liquid inlet 13 stopping processing liquid flow therefrom; and so that when the DC voltage generator 25 outputs a low voltage, contraction of the piezoelectric actuator 23 allows the flexible plate 27 to move away from the processing liquid inlet 13 allowing processing liquid to flow therefrom to the vaporization region 21.

The conventional injection valve 11 is configured such that the relative sizes of the orifice 19 and the vaporization region 21, and the pressures, flow rates and relative direction of the processing liquid and carrier gas flow cause a pressure drop within the vaporization region 21, as is conventionally known in the art. This pressure drop causes processing liquid supplied to the processing liquid inlet 13 to vaporize as it passes from the processing liquid inlet 13, through the orifice 19 to the vaporization region 21. In order to facilitate vaporization, the orifice 19 is small, and thus vulnerable to clogging. Optional heating elements 28 may further facilitate vaporization.

Outside the conventional injection valve 11, the processing liquid inlet 13 is coupled to a liquid flow meter 33 of the vaporization stage 10 which controls the flow rate of processing liquid traveling to the conventional injection valve 11. The liquid flow meter 33 also is coupled via a line 35 to a source of processing liquid 37 within the vaporization stage 10, which in turn is coupled to a source of pressurized inert gas 39 such as helium. The outlet 17 of the injection valve 11 is coupled to a processing chamber (not shown).

In operation, to vaporize processing liquid, the DC voltage generator 25 outputs a low voltage. The piezoelectric 23 therefore is in an unextended state, leaving the orifice 19 open. Pressurized helium from the inert gas source 39 forces the processing liquid from the processing liquid source 37 through the line 35 to the liquid flow meter 33. The liquid flow meter 33 controls the flow rate of the processing liquid as it travels from the liquid flow meter 33 through the processing liquid inlet 13 and the orifice 19 to the vaporization region 21 of the injection valve 11. A pressurized carrier gas, such as helium, flows through the carrier gas inlet 15 into the vaporization region 21.

Due to the pressure decrease experienced as the processing liquid travels from the orifice 19 to the vaporization region 21, the processing liquid vaporizes and mixes with the carrier gas as the processing liquid enters the vaporization region 21. The vaporized processing liquid/carrier gas mixture flows from the injection valve 11 to a processing chamber (not shown) via the outlet 17.

Unfortunately, in practice, the processing liquid often reacts with contaminants (e.g., moisture) or impurities in the processing liquid, in the carrier gas or in the processing liquid delivery system and/or reacts with the material of the processing liquid delivery system itself, causing residue which can clog the carrier gas inlet 15, the processing liquid inlet 13 and/or the outlet 17, and which can deposit in the vaporization region 21 preventing the flexible plate 27 from effectively sealing the processing liquid inlet 13. It is this clogging and ineffective sealing that the present invention overcomes.

Figure 2A:
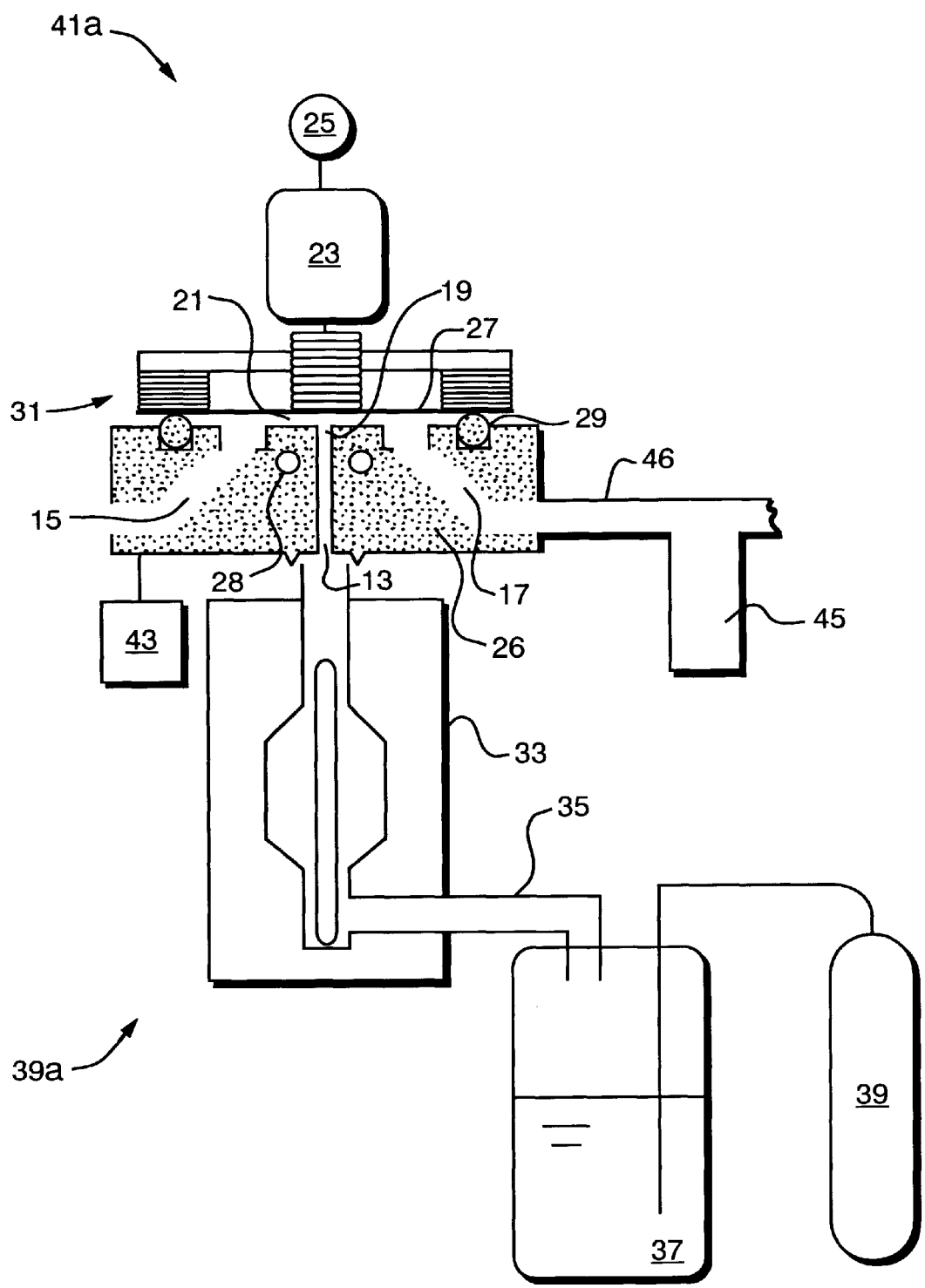
FIGS. 2A and 2B are diagrammatic side elevational views of a vaporization stage comprising an inventive injection valve configured in accordance with a first and a second embodiment, respectively, of the invention.

FIG. 2A is a diagrammatic side elevational view of a vaporization stage 39a comprising a first embodiment of an inventive injection valve 41a which employs all the components of the conventional injection valve 11 of FIG. 1. Thus, only the inventive components of the injection valve 41a are described with reference to FIG. 2A. Specifically, the inventive injection valve 41a comprises a wave generator 43 which is operatively coupled to the injection block 12 so as to output a voltage wave, preferably an ultrasonic sine wave, to the injection block 12. The ultrasonic sine wave causes the injection block 12 to vibrate at an ultrasonic rate. The ultrasonic vibration of the injection block reduces or prevents injection valve clogging, by dislodging residue from the vaporization region 21, the carrier gas inlet 15, the processing liquid inlet 13, and the outlet 17, and/or by preventing residue from lodging therein. An optional trap 45 is coupled to the gas line 46 between the outlet 17 and a processing chamber (not shown).

In operation, to clean the injection valve 41a, the DC voltage generator 25 outputs a low voltage, the piezoelectric 23 is in an unextended state, and processing liquid enters the vaporization region 21 and vaporizes, as described with reference to FIG. 1. While processing liquid is vaporizing, the wave generator 43 is energized and, for example, outputs an ultrasonic sine wave to the injection block 12. The ultrasonic sine wave vibrates the injection block 12, dislodging residue from the injection valve 41a and deterring new residue from lodging therein. The residue is carried out of the injection valve 41a into the gas line 46 and, due to gravity, collects in the trap 45 rather than being carried into the processing chamber (not shown). With use of the trap 45, the ultrasonic sine wave may be applied to the injection block 26 whenever processing liquid vaporization occurs. However, the ultrasonic sine wave preferably is applied periodically, such as prior to a weekly chamber cleaning process, in which case the trap 45 may be omitted.

Figure 2B:
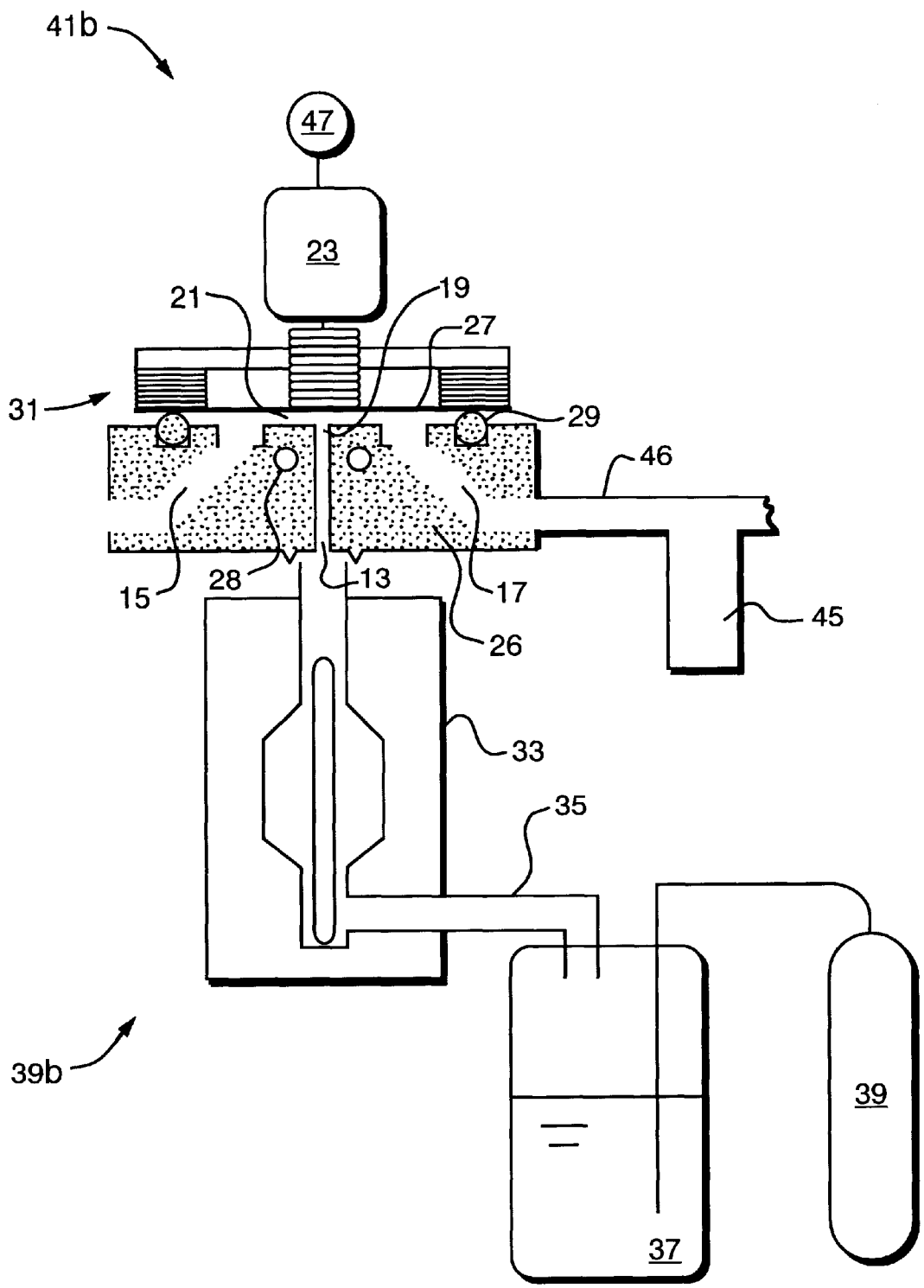

FIG. 2B is a diagrammatic side elevational view of a vaporization stage 39b comprising a second preferred embodiment of an inventive injection valve 41b which employs all the components of the conventional injection valve 11 of FIG. 1. However, the DC voltage generator 25 of FIG. 1 is replaced with a wave generator 47. The wave generator 47 is adjustable so as to output a sonic wave (preferably an ultrasonic sine wave) having a sufficient frequency for vibrationally dislodging residue, so as to output a constant high DC voltage (e.g., a 100% duty cycle sine wave with a DC offset) for closing the injection valve 41b and so as to output zero volts for opening the injection valve 41b. Like the injection valve 41a of FIG. 2A, the injection valve 41b of FIG. 2B has an optional trap 45 coupled to the gas line 46 between the outlet 17 and a processing chamber (not shown).

In operation to sonically clean the injection valve 41b, the wave generator 43 is energized and adjusted so as to output a wave (e.g., an ultrasonic sine wave) to the piezoelectric 23. The piezoelectric 23 vibrates at an ultrasonic rate causing the flexible plate 27 to vibrate at an ultrasonic rate, thereby dislodging residue from the vaporization region 21. Preferably the amplitude of the sine wave is equal to the DC voltage level required to close the injection valve 41b. Thus, the ultrasonic vibration is also transmitted to the injection block 12 as the flexible plate 27 impacts thereagainst. The ultrasonic vibration dislodges residue from the vaporization region 21, and from the various passageways of the injection block 26. The residue is carried out of the injection valve 41b into the gas line 46 and, due to gravity, collects in the trap 45 rather than being carried into the processing chamber (not shown). Like the vaporization state 39a of FIG. 2A, the ultrasonic sine wave may be applied whenever processing liquid vaporization occurs. However, preferably the ultrasonic sine wave is applied periodically such as prior to a weekly chamber cleaning process, in which case the trap 45 may be omitted.

Figure 3:
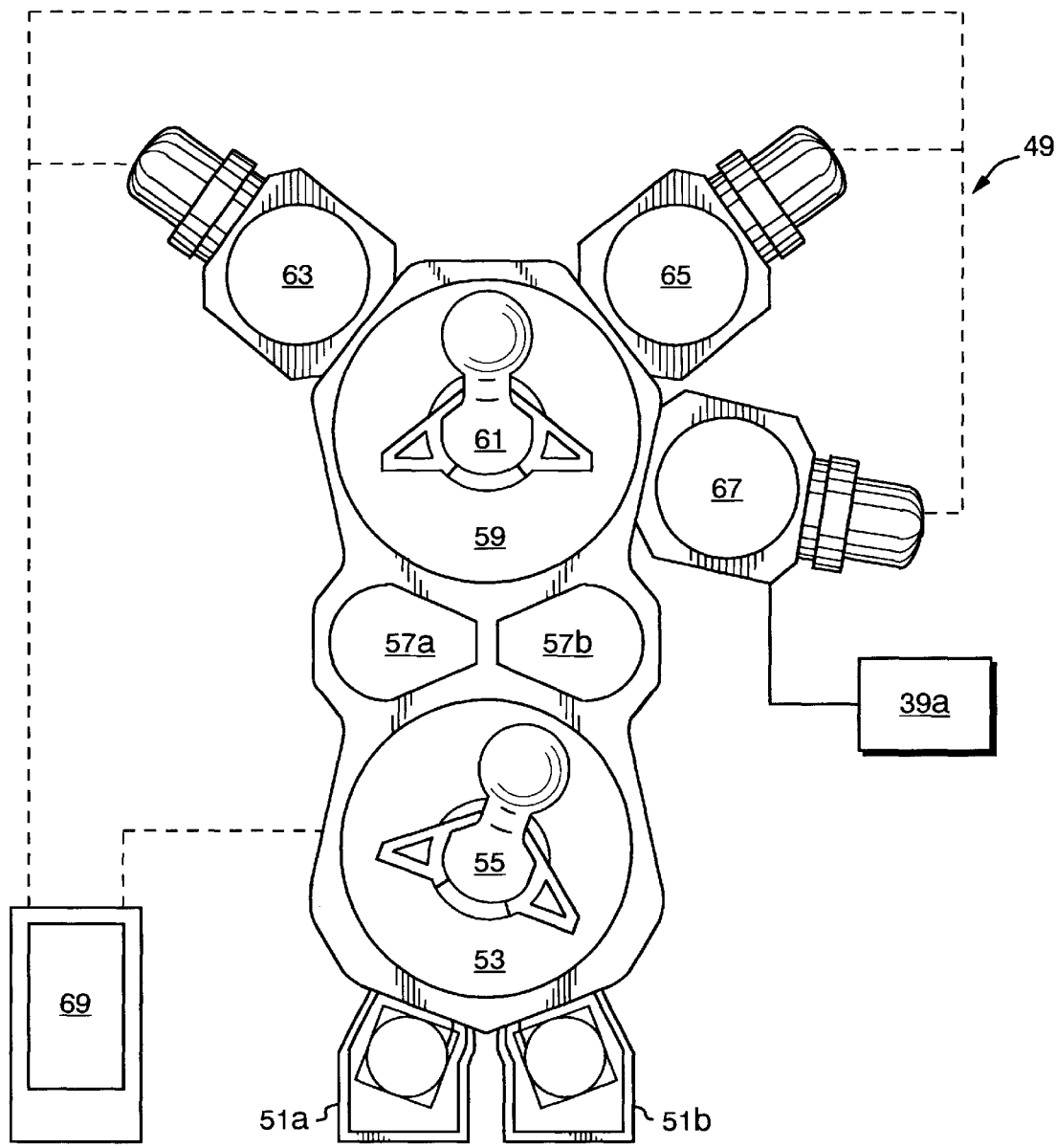
FIG. 3 is a top plan view of an automated tool for semiconductor device fabrication which employs the inventive vaporization stage of FIG. 2A.

FIG. 3 is a top plan view of an automated tool 49 for fabricating semiconductor devices. The tool 49 comprises a pair of load locks 51a, 51b, and a first transfer chamber 53 containing a first wafer handler 55. The first transfer chamber 53 is operatively coupled to the pair of load locks 51a, 51b and to a pair of pass-through chambers 57a, 57b. The pair of pass-through chambers 57a, 57b are further coupled to a second transfer chamber 59 containing a second wafer handler 61, and to a plurality of processing chambers 63, 65. Most importantly, the second transfer chamber 59 is coupled to a processing chamber 67 which is further coupled to the inventive vaporization stage 39a of FIG. 2A. The processing chamber 67 is configured to perform a semiconductor fabrication process, such as to perform chemical vapor deposition of silicon dioxide by flowing TEOS, TEPO and tetraethel borate (TEB) into the processing chamber 67. The entire tool 49 is controlled by a controller 69 (which comprises a microprocessor and a memory—not shown) having a program therein, which controls semiconductor wafer transfer among the load locks 51a, 51b, the pass-through chambers 57a, 57b, and the processing chambers 63, 65, 67, and which controls processing therein.

The controller program and the overall configuration of the tool 49 is designed for optimal productivity. A clogged injection valve within such a tool is particularly costly, as it can affect the productivity of the entire tool 49, including the plurality of processing chambers contained therein. By employing the inventive injection valve 41a or 41b, the value of the automated semiconductor processing tool 49 increases significantly.

The foregoing description discloses only the preferred embodiments of the invention, modifications of the above disclosed apparatus and method which fall within the scope of the invention will be readily apparent to those of ordinary skill in the art. For example, while the specific injection valve shown and described herein is preferred, other injection valves may be provided with sonic vibration so as to reduce or avoid clogging. Thus, while the opening and closing of the preferred injection valve's processing gas inlet is achieved via a flexible plate coupled to a piezoelectric actuator, other mechanisms (i.e., control valves) may be employed to open and close the inventive injection valve's processing gas inlet. Further, although the waves applied to the inventive injection valve are preferably sine waves, other waves such as square waves, pulsed waves, or a random signal may be applied. The wave generator of the present invention therefore may output any type of signal sufficient to vibrate the injection valve's vaporization region. Ultrasonic waves are presently preferred as they have been proven to provide sufficient vibration. Finally, vaporization is not necessary for residue to be dislodged from the injection valve's vaporization region. For example, residue may be dislodged by vibrating the injection valve while flowing only processing liquid, without carrier gas, into the vaporization region.

Accordingly, while the present invention has been disclosed in connection with the preferred embodiments thereof, it should be understood that other embodiments may fall within the spirit and scope of the invention, as defined by the following claims.

The invention claimed is:

1. An injection valve comprising:
   a vaporization region;
   a processing liquid inlet coupled to the vaporization region;
   a carrier gas inlet coupled to the vaporization region;
   an outlet coupled to the vaporization region for outletting a mixture of carrier gas and vaporized processing liquid; and
   a wave generator operatively coupled to the vaporization region so as to vibrate the vaporization region.

2. The apparatus of claim 1 wherein the processing liquid inlet, the carrier gas inlet and the outlet are formed in an injection block; and wherein the wave generator is coupled to the injection block.

3. A system for processing semiconductor wafers, comprising:
   processing chamber;
   a processing liquid supply system operatively coupled to the processing chamber, and
   the injection valve of claim 2 coupled within the processing liquid supply system, for vaporizing processing liquid to be supplied to the processing chamber.

4. A semiconductor wafer fabrication tool, comprising:
   a wafer transfer chamber having a wafer handler therein;
   a load lock chamber operatively coupled to the wafer transfer chamber; and
   the semiconductor wafer processing system of claim 3, operatively coupled to the wafer transfer chamber.

5. The apparatus of claim 1 further comprising a flexible plate that defines the vaporization region and which is used to close the processing liquid inlet, wherein the wave generator is operatively coupled to the flexible plate.

6. The apparatus of claim 5 further comprising:
   a piezoelectric operatively coupled to the flexible plate, wherein the wave generator is operatively coupled to the piezoelectric.

7. A system for processing semiconductor wafers, comprising:
   a processing chamber;
   a processing liquid supply system operatively coupled to the processing chamber, and
   the injection valve of claim 4 coupled within the processing liquid supply system, for vaporizing processing liquid to be supplied to the processing chamber.

8. A semiconductor wafer fabrication tool, comprising:
   a wafer transfer chamber having a wafer handler therein;
   a load lock chamber operatively coupled to the wafer transfer chamber; and
   the semiconductor wafer processing system of claim 7, operatively coupled to the wafer transfer chamber.

9. The apparatus of claim 6 wherein the wave generator is adjustable so as to open the processing liquid inlet, close the processing liquid inlet and vibrate the vaporization region via a voltage signal output to the piezoelectric.

10. A system for processing semiconductor wafers, comprising:

a processing chamber;

a processing liquid supply system operatively coupled to the processing chamber, and the injection valve of claim 5 coupled within the processing liquid supply system, for vaporizing processing liquid to be supplied to the processing chamber.

11. A semiconductor wafer fabrication tool, comprising:

a wafer transfer chamber having a wafer handler therein;

a load lock chamber operatively coupled to the wafer transfer chamber; and the semiconductor wafer processing system of claim 10, operatively coupled to the wafer transfer chamber.

12. The apparatus of claim 1 further comprising a control valve operatively coupled to the processing liquid inlet, for opening and closing the processing liquid inlet, wherein the wave generator is operatively coupled to the control valve.

13. A system for processing semiconductor wafers, comprising:

a processing chamber;

a processing liquid supply system operatively coupled to the processing chamber, and the injection valve of claim 1 coupled within the processing liquid supply system, for vaporizing processing liquid to be supplied to the processing chamber.

14. A semiconductor wafer fabrication tool, comprising:

a wafer transfer chamber having a wafer handler therein;

a load lock chamber operatively coupled to the wafer transfer chamber; and the semiconductor wafer processing system of claim 13, operatively coupled to the wafer transfer chamber.

15. An injection valve comprising:

a vaporization region;

a processing liquid inlet coupled to the vaporization region;

a flexible plate that defines the vaporization region and which is used to close the processing liquid inlet;

a piezoelectric operatively coupled to the flexible plate;

a carrier gas inlet coupled to the vaporization region;

an outlet coupled to the vaporization region for outletting a mixture of carrier gas and vaporized processing liquid; and a wave generator operatively coupled to the piezoelectric wherein the wave generator is adjustable so as to open the processing liquid inlet, close the processing liquid inlet and vibrate the vaporization region via a voltage signal output to the piezoelectric.

16. An injection valve comprising:

a plate that defines a vaporization region;

a piezoelectric coupled to the plate;

a processing liquid inlet coupled to the vaporization region;

a carrier gas inlet coupled to the vaporization region;

an outlet coupled to the vaporization region and adapted to output a mixture of carrier gas and vaporized processing liquid; and a wave generator coupled to the piezoelectric wherein the wave generator is adjustable so as to open the processing liquid inlet, close the processing liquid inlet and vibrate the vaporization region via a voltage signal output to the piezoelectric.

17. The apparatus of claim 16 wherein the wave generator outputs a voltage signal of zero volts to open the processing liquid inlet.

18. The apparatus of claim 16 wherein the wave generator outputs a voltage signal having a sonic frequency to vibrate the vaporization region.

19. The apparatus of claim 16 wherein the wave generator outputs a D.C. voltage signal to close the processing liquid inlet.

20. The apparatus of claim 19 wherein the wave generator outputs a voltage signal having both a D.C. voltage to close the processing liquid inlet and a sonic frequency to vibrate the vaporization region.

* * * * *